(12) United States Patent
Chen

(10) Patent No.: US 7,786,490 B2
(45) Date of Patent: Aug. 31, 2010

(54) MULTI-CHIP MODULE SINGLE PACKAGE STRUCTURE FOR SEMICONDUCTOR

(75) Inventor: Jen-Shyan Chen, Hsinchu (TW)

(73) Assignee: Neobule Technologies, Inc., Brunei Darussalam ( * ) Notice: Subject to any disclaimer, the term of this patent is extended or adjusted under 35 U.S.C. 154(b) by 172 days.

(21) Appl. No.: 12/085,444

(22) PCT Filed: Nov. 28, 2005

(86) PCT No.: PCT/CN2005/002033

§ 371 (c)(1),
(2), (4) Date: May 23, 2008

(87) PCT Pub. No.: WO2007/059657

PCT Pub. Date: May 31, 2007

(65) Prior Publication Data

US 2009/0272988 A1    Nov. 5, 2009

(51) Int. Cl.
*H01L 27/15* (2006.01)
*H01L 21/00* (2006.01)

(52) U.S. Cl. .............................. 257/79; 257/80; 257/81; 257/88; 257/E33.001; 257/E33.059; 438/22; 438/24; 438/25

(58) Field of Classification Search ............. 257/79–81, 257/88, 95, 98–100, 687, 774; 438/22, 24–29
See application file for complete search history.

(56) References Cited

U.S. PATENT DOCUMENTS

| | | | |
|---|---|---|---|
| 6,310,364 B1 | 10/2001 | Uemura | |
| 6,809,261 B1 | 10/2004 | Ng et al. | |
| 6,835,960 B2 | 12/2004 | Lin et al. | |
| 6,936,855 B1 | 8/2005 | Harrah | |
| 2001/0003372 A1 | 6/2001 | Huang et al. | |
| 2002/0105002 A1 | 8/2002 | Ono | |
| 2004/0047151 A1 | 3/2004 | Bogner et al. | |
| 2004/0079957 A1 | 4/2004 | Andrews et al. | |
| 2004/0124487 A1 | 7/2004 | Loh | |
| 2007/0291489 A1* | 12/2007 | Baroky et al. | 362/294 |
| 2009/0101932 A1* | 4/2009 | Chen | 257/99 |

FOREIGN PATENT DOCUMENTS

| | | |
|---|---|---|
| CN | 1436374 A | 12/2001 |
| CN | 1466782 A | 8/2002 |
| CN | 2612075 Y | 2/2003 |
| CN | 1538538 A | 4/2004 |
| CN | 1684278 A | 4/2004 |
| EP | 1 467 417 A2 | 4/2004 |
| JP | 2004-260048 | 2/2003 |
| TW | M261835 | 7/2004 |

OTHER PUBLICATIONS

International Search Report of PCT/CN2005/002033 mailed May 20, 2006.

* cited by examiner

*Primary Examiner*—Hsien-ming Lee
(74) *Attorney, Agent, or Firm*—Thomas, Kayden, Horstemeyer & Risley, LLP.

(57) ABSTRACT

The invention is to provide a semiconductor light-emitting device package structure. The semiconductor light-emitting device package structure includes a substrate, N sub-mounts and N semiconductor light-emitting die modules, where N is a positive integer lager than or equal to 2. Each of the sub-mounts is embedded on the substrate and exposed partially. Each of the semiconductor light-emitting die modules is mounted on the exposed surface of one of the sub-mounts.

16 Claims, 6 Drawing Sheets

MULTI-CHIP MODULE SINGLE PACKAGE STRUCTURE FOR SEMICONDUCTOR

BACKGROUND OF THE INVENTION

1. Field of the Invention

The present invention is related to a semiconductor light-emitting device package structure, and more particularly, to a multi-chip module single package structure for semiconductor light-emitting dies.

2. Description of the Prior Art

Because of the advantages of long life span, light weight, low power consumption, and absence of mercury, semiconductor light-emitting devices, such as light-emitting diode (LED), has become an ideal light source, and it has been greatly developed. LED can be applied in many fields, including information, communication, consumer electronics, vehicles, traffic light, billboard, and illumination market.

However, current high power semiconductor light emitting devices face a problem of overheating after continued lighting for a period. Furthermore, current semiconductor light-emitting device package structures generally face the problem of exceeding heat resistance, which affects the power and efficiency of lighting. Therefore, conventional semiconductor light emitting device package structures can not reduce the temperature of the light emitting device by simply providing a heat sink. Accordingly, there is a need to provide a package structure with high heat dissipating efficiency to solve the problem of exceeding heat resistance between the interface of the package structure and the heat dissipating module.

Furthermore, the conventional package structure for semiconductor light-emitting device is applied for packaging single semiconductor light-emitting device. However, to deal with the development of novel lighting product, there is a need to develop a multi-chip module single package structure for semiconductor light-emitting dies.

SUMMARY OF THE INVENTION

Accordingly, a scope of the invention is to provide a multi-chip module single package structure for semiconductor light-emitting dies.

In a preferred embodiment, a multi-chip module single package structure of the invention includes a substrate, N sub-mounts, and N semiconductor light-emitting die modules. The substrate thereon defines a top surface and a bottom surface, and N first recesses are formed on the top surface, and N second recesses are formed on the bottom surface. Each of the second recesses is passed through and linked together with one of the first recesses. A plurality of outer electrodes are disposed on the top surface. Moreover, N is a positive integer equal to or larger than 2. Particularly, the substrate is not formed by injection molding.

Additionally, each of the N sub-mounts corresponds to one of the second recesses and thereon defines a respective first surface and a respective second surface. Each of the sub-mounts is embedded in the corresponding second recess such that the first surface of said one sub-mount is partially exposed within the corresponding first recess.

Furthermore, each of the N semiconductor light-emitting die modules corresponds to one of the sub-mounts and is mounted on the exposed first surface of the corresponding sub-mount within the corresponding first recess. Each of the semiconductor light-emitting die modules is via the inner electrodes thereof electrically connected to the outer electrodes.

The scope of the present invention will no doubt become obvious to those of ordinary skill in the art after reading the following detailed description of the preferred embodiment, which is illustrated in the various figures and drawings.

BRIEF DESCRIPTION OF THE APPENDED DRAWINGS

DETAILED DESCRIPTION OF THE INVENTION

The present invention is to provide a multi-chip module single package structure for semiconductor light-emitting dies. The preferred embodiments are disclosed as below.

Figure 1A:
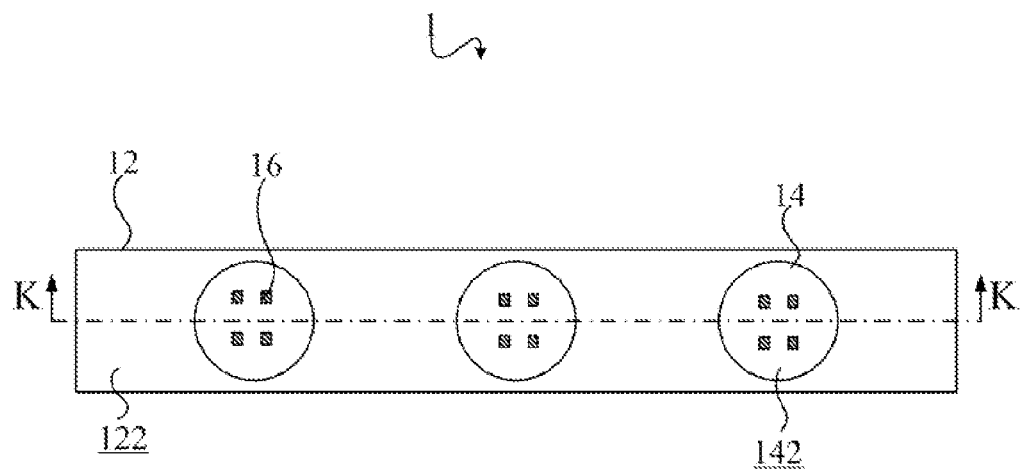
FIG. 1A shows a top view of a semiconductor light-emitting device package structure 1 of a preferred embodiment of the invention.
Figure 1B:
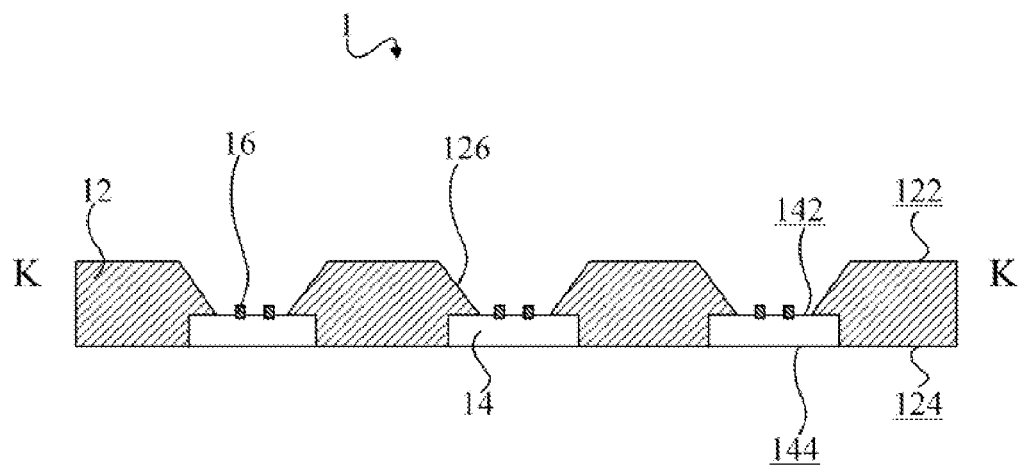
FIG. 1B shows a sectional view of the semiconductor light-emitting device package structure 1 in FIG. 1A along the line K-K.

Please refer to FIG. 1A and FIG. 1B. FIG. 1A shows a top view of a semiconductor light-emitting device package structure 1 of a preferred embodiment of the invention. FIG. 1B shows a sectional view of the semiconductor light-emitting device package structure in FIG. 1A along the line K-K. As shown in FIG. 1A, the semiconductor light-emitting device package structure 1 includes a substrate 12, N sub-mounts 14, and N semiconductor light-emitting die modules 16, and N is a positive integer equal to or larger than 2. Particularly, the semiconductor light-emitting device package structure 1 of FIG. 1A and FIG. 1B has three semiconductor light-emitting die modules as an example of the invention.

Furthermore, as shown in FIG. 1B, the substrate 12 thereon defines a top surface 122 and a bottom surface 124. Additionally, N first recesses 126 are formed on the top surface 122, whereas N second recesses 128 are formed on the bottom surface 124. Particularly, each of the second recesses 128 is passed through and linked together with one of the first recesses 126. Moreover, a plurality of external electrodes (not shown) are disposed on the top surface 122.

In addition, each of the N sub-mounts 14 corresponds to one of the second recesses 128 and thereon defines a respective first surface 142 and a respective second surface 144. Furthermore, each of the sub-mounts 14 is embedded in the corresponding second recess 128, such that the first surface 142 of said one sub-mount 14 is partially exposed within the corresponding first recess 126. In practice, each of the N sub-mounts 14 can be formed of a semiconductor material.

Figure 2:
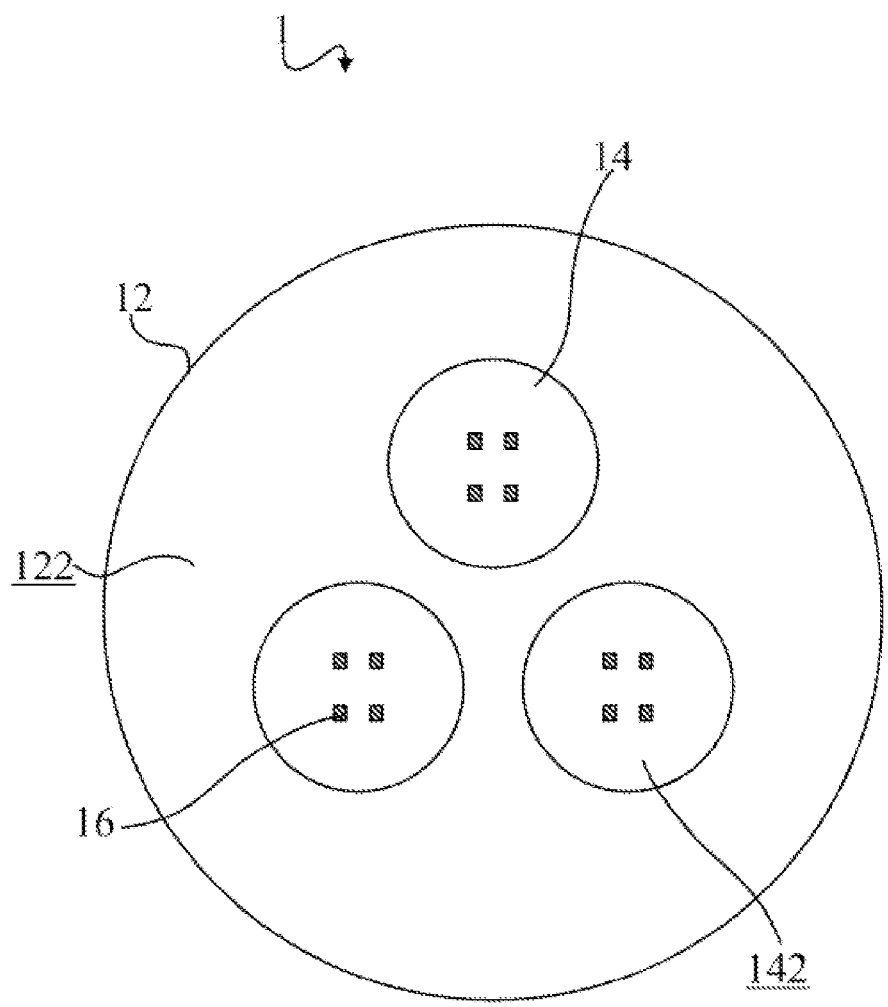
FIG. 2 shows another embodiment of the semiconductor light-emitting device package structure in FIG. 1A.

Furthermore, each of the N semiconductor light-emitting die modules 16 corresponds to one of the sub-mounts 14 and is mounted on the exposed first surface 142 of the corresponding flat sub-mount 14 within the corresponding first recess 126. Moreover, each of the semiconductor light-emitting die modules 16 has inner electrodes 35 thereof, which are electrically connected to the outer electrodes 33. In practice, the shape of the substrate is not limited; for example, the substrate 12 of FIG. 1A is a rectangle. However, for example, the substrate 12 shown in FIG. 2 is a circle. Furthermore, in FIG. 2, units that have the same numerical label as in FIG. 1A perform the same function as the respective units in FIG. 1A, and discussion of unnecessary details will be omitted.

In an embodiment, the semiconductor light-emitting device package structure 1 of the invention further includes N protruding portions (not shown) and a package material (not shown). Each of the N protruding portions is formed around the edge of each first recess 126 on the top surface 122. The package material is respectively filled into each of the protruding portions to cover each semiconductor light-emitting die module 16.

In another embodiment, the semiconductor light-emitting device package structure 1 of the invention further includes a protruding portion (not shown) and a package material (not shown). The protruding portion is formed on the top surface 122 to compass every first recess 126. The package material is integratively filled into the protruding portion to cover all of the semiconductor light-emitting die modules 16.

In another embodiment, the semiconductor light-emitting device package structure 1 of the invention further includes a transparent cover (not shown), which is disposed on the top surface 122, for integratively covering all of the first recesses 126.

Figure 3A:
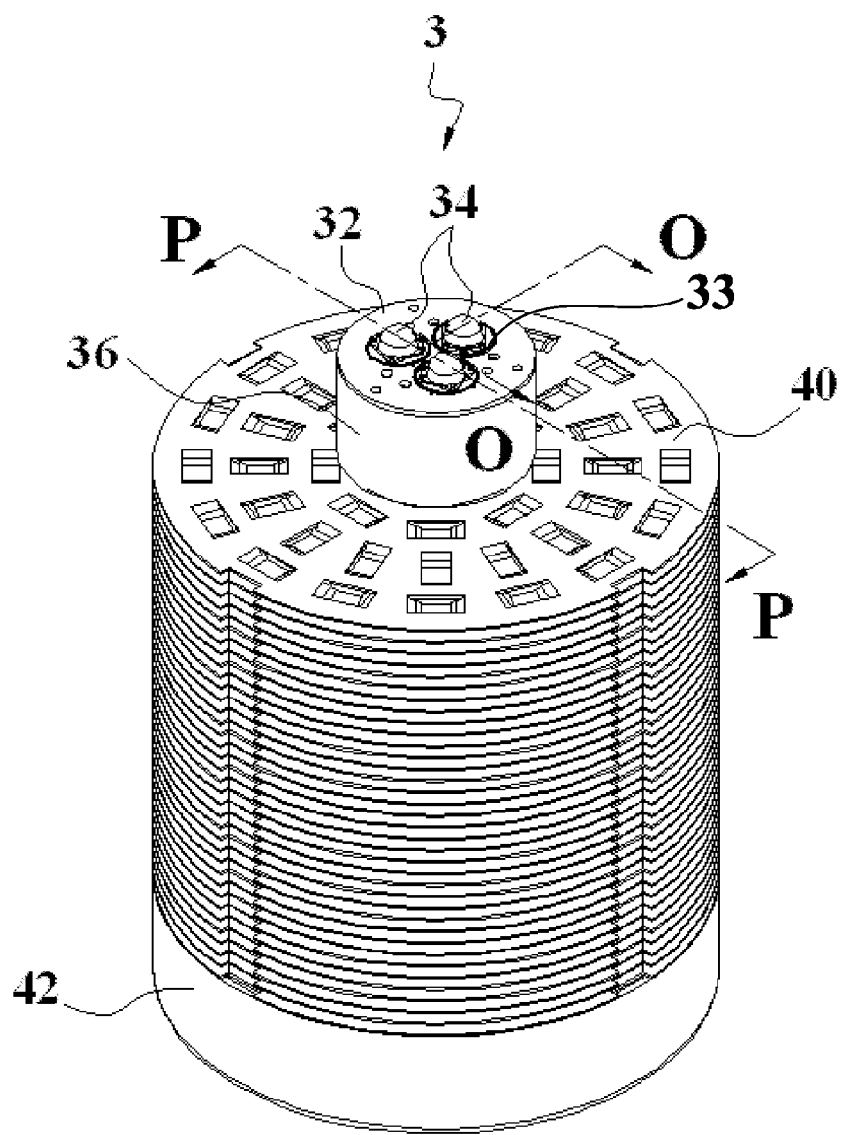
FIG. 3A shows a semiconductor light-emitting device package structure 3 of another preferred embodiment of the invention.
Figure 3B:
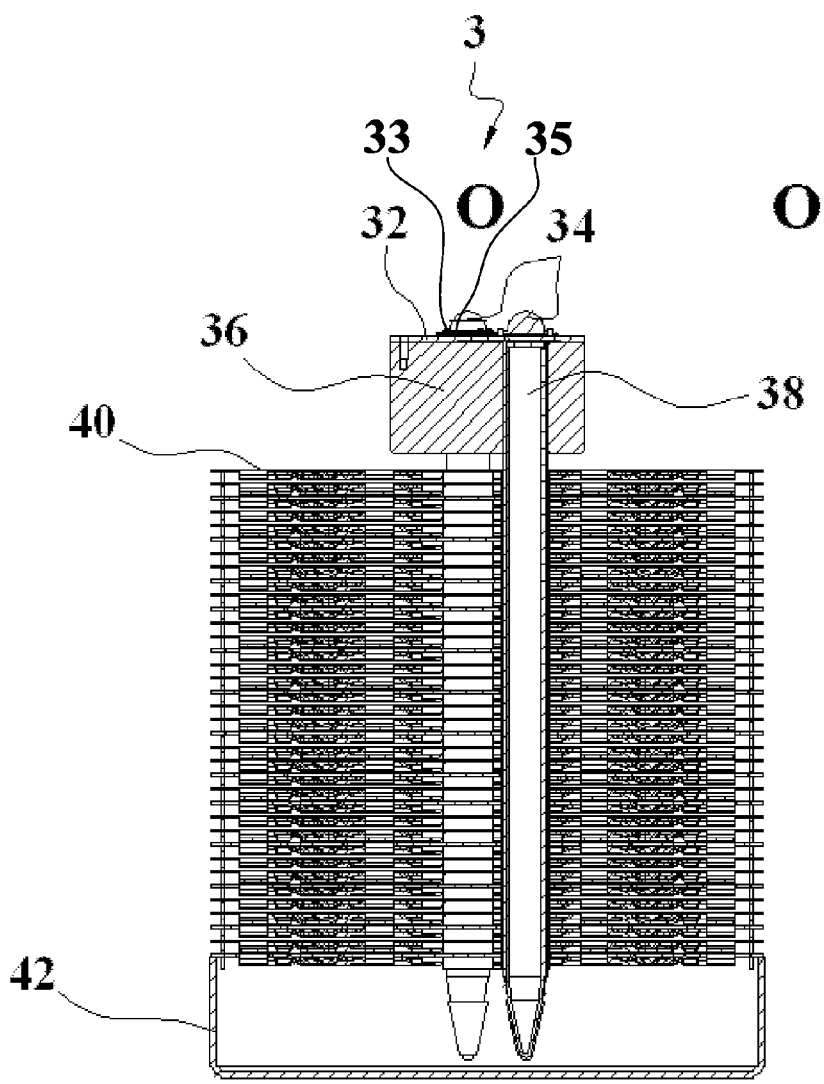
FIG. 3B shows a sectional view of the semiconductor light-emitting device package structure 3 in FIG. 3A along the line O-O.

Referring to FIG. 3A and FIG. 3B, FIG. 3A illustrate a semiconductor light-emitting device package structure of another preferred embodiment of the invention, and FIG. 3B shows a sectional view of the semiconductor light-emitting device package structure 3 in FIG. 3A along the line O-O. Similarly, the semiconductor light-emitting device package structure 3 also includes a substrate 32, N sub-mounts (not shown), and N semiconductor light-emitting die modules 34, wherein N is a positive integer equal to or larger than 2. Furthermore, FIG. 3A shows three semiconductor light-emitting die modules 34.

Furthermore, the semiconductor light-emitting device package structure 3 further includes a carrier 36 and N heat-conducting devices 38 with a substantial column shape. Each of the N heat-conducting devices 38 has a respective flat portion. Furthermore, the substrate 32 is via the bottom surface thereof mounted on the carrier 36. The carrier 36 has N formed-through holes which each corresponds to one of the sub-mounts, each of the holes is adapted to receive the insertion of one of the heat-conducting devices 38 such that the flat portion of said one heat-conducting device 38 is tightly bonded with the corresponding sub-mount.

In an embodiment, each heat-conducting device 38 is a heat pipe or a heat column.

In an embodiment, each heat-conducting device 38 is formed of copper, aluminum, or a material with high heat conductivity.

As shown in FIG. 3A and FIG. 3B, the semiconductor light-emitting device package structure 3 further includes at least a heat-dissipating fin 40. The heat-dissipating fin 40 is mounted on circumferences of the heat-conducting devices 38.

Figure 3C:
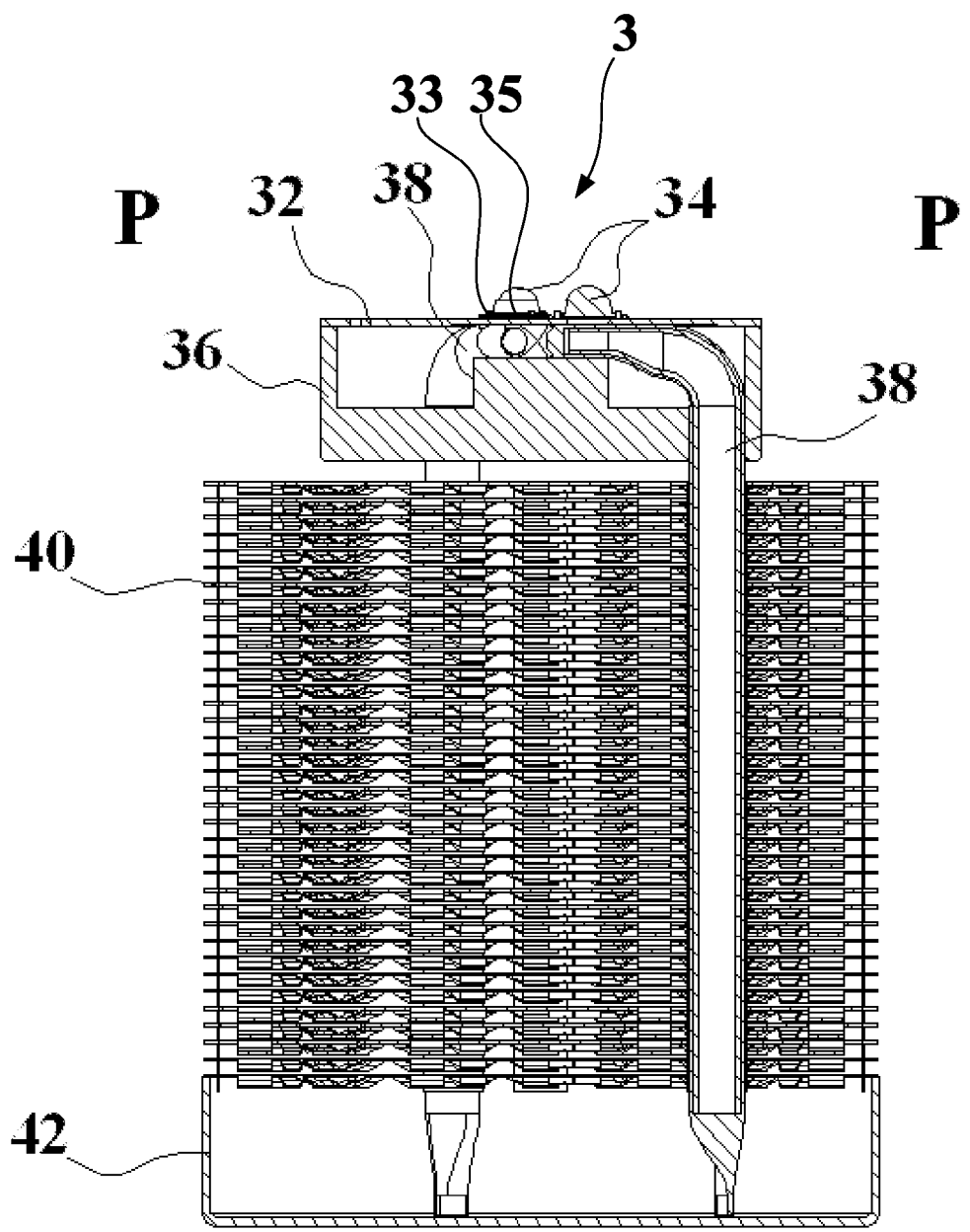
FIG. 3C is a partial sectional view of the semiconductor light-emitting device package structure of FIG. 3A along the line P-P for illustrating another form of the semiconductor light-emitting device package structure.

As shown in FIG. 3A to FIG. 3C, the semiconductor light-emitting device package structure 3 further includes a fixing device 42, and the tail ends of the heat-conducting devices 38 are fixed on the fixing device 42.

Please refer to FIG. 3C. FIG. 3 is a partial sectional view of the semiconductor light-emitting device package structure 3 of FIG. 3A along the line P-P, to clearly show the semiconductor light-emitting device package structure 3. Furthermore, in FIG. 3C, units have the same numerical label as in FIG. 3B, and they perform the same functions as the respective units in FIG. 3B, so discussion of unnecessary details will be omitted. However, different from the semiconductor light-emitting device package structure 3 of FIG. 3B, the front end of each of the heat-conducting devices 38 of the semiconductor light-emitting device package structure 3 of FIG. 3C is curved, and the flat portion of each of the heat-conducting devices 38 is formed around the front end thereof.

Figure 4:
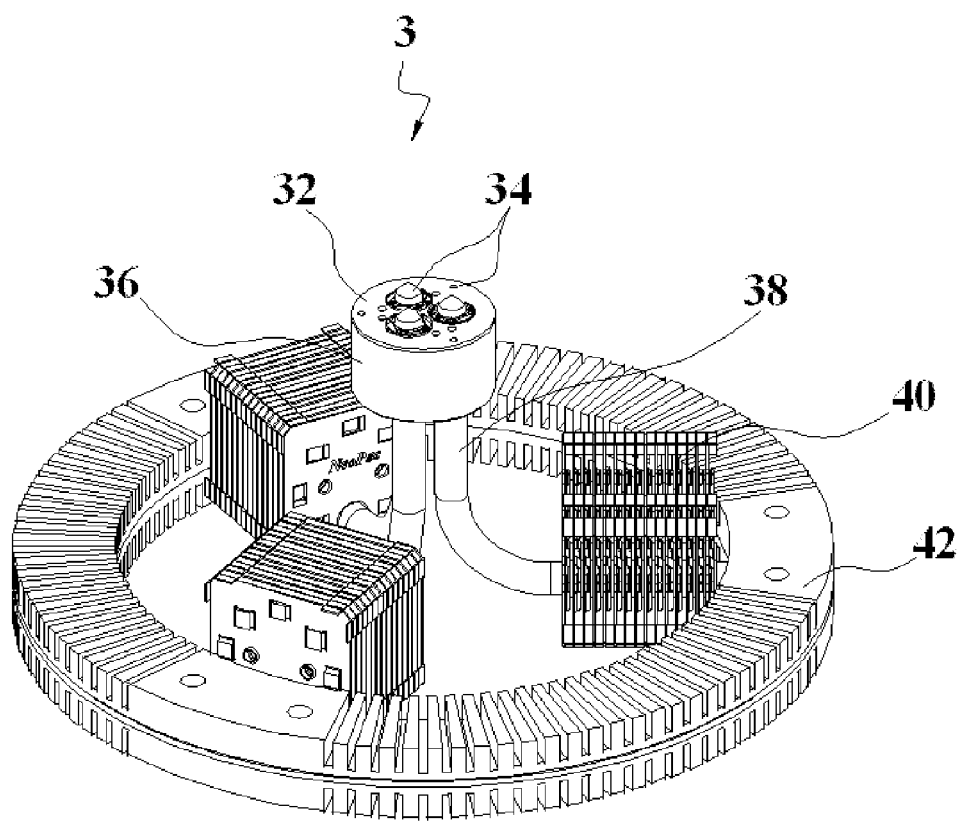
FIG. 4 shows another embodiment of the semiconductor light-emitting device package structure 3 in FIG. 3A.

Please refer to FIG. 4. FIG. 4 shows another embodiment of the semiconductor light-emitting device package structure 3 in FIG. 3A. Furthermore, in FIG. 4, units that have the same numerical label as in FIG. 3A or FIG. 3B perform the same function as the respective units in FIG. 3A and FIG. 3B, and discussion of unnecessary details will be omitted. The difference between the semiconductor light-emitting device package structure in FIG. 4 and FIG. 3A/3B is that the fixing device 42 of the semiconductor light-emitting device package structure 3 in FIG. 4 has a round shape.

Another difference between the semiconductor light-emitting device package structure in FIG. 4 and FIG. 3A/3B is that the semiconductor light-emitting device package structure 3 in FIG. 4 further includes N sets of heat-dissipating fins 40. Moreover, each set of the heat-conducting fins 40 is mounted on a circumference of one of the heat-conducting devices 38.

In an embodiment, the above-mentioned semiconductor light-emitting device package structure further includes a shade with an aperture adapted to the substrate. Furthermore, the substrate is inserted into the aperture such that the semiconductor light-emitting semiconductor light-emitting die modules are disposed in the shade.

In an embodiment, the above-mentioned semiconductor light-emitting device package structure further includes an optical module 37. The optical module 37 is mounted on the top surface to cover the semiconductor light-emitting die modules to focus the light emitted by the semiconductor light-emitting die modules.

In an embodiment, the above-mentioned semiconductor light-emitting device package structure further includes N optical modules 37. Each of the N optical modules 37 is mounted on the top surface to cover one of the semiconductor light-emitting die modules to focus the light emitted by said one semiconductor light-emitting die module.

In an embodiment, the above-mentioned semiconductor light-emitting device package structure further includes a plurality of wires respectively electrically connected to the outer electrodes 33 and extended to the tail ends of the heat-conducting devices.

In an embodiment, each of the semiconductor light-emitting die modules of the above-mentioned semiconductor light-emitting device package structure includes at least one white light diode. In another embodiment, one of the semiconductor light-emitting die modules can include at least a blue light diode, a green light diode, or a red light diode. In another embodiment, one of the semiconductor light-emitting die modules includes at least one blue light diode, at least one green light diode, and at least one red light diode.

Obviously, the invention provides a package structure with high heat dissipating efficiency, and the package structure is used to package at least a semiconductor light-emitting device. Furthermore, the package structure of the invention can also be used to coordinate with a heat conducting device to further eliminate the heat generated by a high power semiconductor light emitting device, so as to solve the problem of exceeding heat resistance between the interface of the package structure and the heat dissipating module.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A semiconductor light-emitting device package structure, comprising:
    a substrate thereon defining a top surface and a bottom surface, N first recesses being formed on the top surface, N second recesses being formed on the bottom surface, each of the second recesses being passed through and linked together with one of the first recesses, a plurality of outer electrodes being disposed on the top surface, N being a positive integer;
    N sub-mounts which each corresponds to one of the second recesses and thereon defines a respective first surface and a respective second surface, each of the sub-mounts being embedded in the corresponding second recess such that the first surface of said one sub-mount is partially exposed within the corresponding first recess; and
    N semiconductor light-emitting die modules which each of the said semiconductor light-emitting die modules corresponds to one of the sub-mounts and is mounted on the exposed first surface of the corresponding sub-mount within the corresponding first recess, each of the semiconductor light-emitting die modules being via inner electrodes thereof electrically connected to the outer electrodes;
    N heat-conducting devices, wherein each of the N heat-conducting devices has a respective flat portion; and
    a carrier, which the substrate is via the bottom surface thereof mounted on, having N formed-through holes, each of the N formed-through holes corresponds to one of the sub-mounts, and each of the N formed-through holes being adapted to receive an insertion of one of the heat-conducting devices such that the flat portion of the one heat-conducting device is tightly bonded with the corresponding sub-mount, wherein at least one heat-dissipating fin mounted on circumferences of the heat-conducting devices.

2. The semiconductor light-emitting device package structure of claim 1, further comprising:
    a package material respectively filled into each of the first recesses to cover each semiconductor light-emitting die module.

3. The semiconductor light-emitting device package structure of claim 1, further comprising:
    a package material integratively filled into all of the first recesses to integratively cover all of the N semiconductor light-emitting die modules.

4. The semiconductor light-emitting device package structure of claim 1, further comprising:
    a transparent cover, disposed on the top surface, for integratively covering all of the semiconductor light-emitting die modules.

5. The semiconductor light-emitting device package structure of claim 1, further comprising:
    N transparent covers, disposed on the top surface, each of the N transparent covers covering one of the semiconductor light-emitting die modules.

6. The semiconductor light-emitting device package structure of claim 1, further comprising:
    N sets of heat-dissipating fins, each set of the heat-conducting fins being mounted on a circumference of one of the heat-conducting devices.

7. The semiconductor light-emitting device package structure of claim 1, wherein each of the heat-conducting devices is a heat pipe or a heat column.

8. The semiconductor light-emitting device package structure of claim 1, wherein each of the heat-conducting devices is formed of copper or aluminum.

9. The semiconductor light-emitting device package structure of claim 1, further comprising:
    an optical module being mounted on the top surface and covering the semiconductor light-emitting die modules to focus the light emitted by the semiconductor light-emitting die modules.

10. The semiconductor light-emitting device package structure of claim 1, further comprising:
    N optical modules, wherein each of the N optical modules is mounted on the top surface and covers one of the semiconductor light-emitting die modules to focus the light emitted by said one semiconductor light-emitting die module.

11. The semiconductor light-emitting device package structure of claim 1, wherein each of the sub-mounts is formed of a semiconductor, a ceramic, or a metal.

12. The semiconductor light-emitting device package structure of claim 1, wherein each of the semiconductor light-emitting die modules comprises at least one white light diode.

13. The semiconductor light-emitting device package structure of claim 1, wherein one of the semiconductor light-emitting die modules comprises a blue light diode.

14. The semiconductor light-emitting device package structure of claim 1, wherein one of the semiconductor light-emitting die modules comprises a green light diode.

15. The semiconductor light-emitting device package structure of claim 1, wherein one of the semiconductor light-emitting die modules comprises a red light diode.

16. The semiconductor light-emitting device package structure of claim 1, wherein one of the semiconductor light-emitting die modules comprises at least one blue light diode, at least one green light diode, and at least one red light diode.

* * * * *